(12) United States Patent
    Chen (10) Patent No.: US 11,778,912 B2
(45) Date of Patent: Oct. 3, 2023

(54) MANUFACTURING METHOD FOR PIEZOELECTRIC CERAMIC CHIP, PIEZOELECTRIC CERAMIC CHIP ASSEMBLY AND DISPLAY DEVICE

(71) Applicant: BOE TECHNOLOGY GROUP CO., LTD., Beijing (CN)

(72) Inventor: Yuju Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 249 days.

(21) Appl. No.: 17/351,418

(22) Filed: Jun. 18, 2021

(65) Prior Publication Data

US 2022/0158079 A1    May 19, 2022

(30) Foreign Application Priority Data

Nov. 18, 2020    (CN) .......................... 202011296362.1

(51) Int. Cl.
    *G06F 3/041*    (2006.01)
    *H10N 30/067*   (2023.01)
    *G06F 3/01*     (2006.01)
    *H10N 30/082*   (2023.01)

(52) U.S. Cl.
    CPC ........... *H10N 30/067* (2023.02); *G06F 3/016* (2013.01); *H10N 30/082* (2023.02)

(58) Field of Classification Search
    None
    See application file for complete search history.

(56) References Cited

U.S. PATENT DOCUMENTS

2013/0335371 A1\* 12/2013 Bayramoglu ....... G06F 3/04144
                                                    345/174

\* cited by examiner

*Primary Examiner* — Carl Adams
(74) *Attorney, Agent, or Firm* — Calfee, Halter & Griswold LLP (57) ABSTRACT

The present disclosure provides a manufacturing method for a piezoelectric ceramic chip, a piezoelectric ceramic chip assembly and a display device. The manufacturing method includes: transferring a piezoelectric ceramic layer and a bottom electrode covering the piezoelectric ceramic layer formed on a substrate to a base plate, forming an insulating layer with an opening on the base plate, so that edges of the piezoelectric ceramic layer and the bottom electrode are covered by the insulating layer, and the piezoelectric ceramic layer is exposed from the opening; etching the base plate by immersing the base plate in an etching solution for etching a material of the bottom electrode; and forming a top electrode in the opening of the insulating layer, so that the top electrode is spaced apart from the insulating layer.

15 Claims, 8 Drawing Sheets

MANUFACTURING METHOD FOR PIEZOELECTRIC CERAMIC CHIP, PIEZOELECTRIC CERAMIC CHIP ASSEMBLY AND DISPLAY DEVICE

CROSS-REFERENCE TO RELATED APPLICATION

This application claims priority to Chinese Patent Application No. 202011296362.1, filed on Nov. 18, 2020, the disclosure of which is incorporated herein by reference in its entirety.

TECHNICAL FIELD

The present disclosure relates to the field of chip technologies, and in particular to a manufacturing method for a piezoelectric ceramic chip, a piezoelectric ceramic chip assembly and a display device.

BACKGROUND

Through a surface tactile representation technology, which is an emerging human-computer interaction technology, characteristics of an object can be perceived by touching a screen with a bare finger, so that efficient and natural interaction is realized on a multimedia terminal, which has great research value.

A surface tactile representation technology based on friction control can achieve fine and continuous texture tactile representation. A piezoelectric ceramics is a material that can be used to realize the surface tactile representation technology based on friction control. When an electric field is applied to a polarization direction of the piezoelectric ceramics, the piezoelectric ceramics will be mechanically deformed in a certain direction to form a certain frictional force, thereby realizing simulation of different tactile/touch sensations.

Surface tactile representation can be realized on the display panel by integrating a piezoelectric ceramic chip with a display panel, thereby improving input experience and functional design of the panel through tactile feedback. Due to process limitations, a current yield of integrating the piezoelectric ceramic chip with the display panel is relatively low, resulting in inaccurate and even ineffective tactile sensory.

It should be noted that the information disclosed in the Background section above is only for enhancing the understanding of the background of the present disclosure, and thus may include information that does not constitute prior art known to those ordinary skilled in the art.

SUMMARY

The present disclosure provides a manufacturing method for a piezoelectric ceramic chip, a piezoelectric ceramic chip assembly and a display device.

According to an aspect of the present disclosure, there is provided a manufacturing method for a piezoelectric ceramic chip, including:
providing a substrate, and forming a piezoelectric ceramic layer and a bottom electrode covering the piezoelectric ceramic layer on the substrate;
providing a base plate, transferring the piezoelectric ceramic layer and the bottom electrode to the base plate, so that the piezoelectric ceramic layer is located on a side of the bottom electrode away from the base plate;
forming an insulating layer with an opening on the base plate, so that edges of the piezoelectric ceramic layer and the bottom electrode are covered by the insulating layer, and the piezoelectric ceramic layer is exposed from the opening;
etching the base plate by immersing the base plate in an etching solution for etching a material of the bottom electrode; and
forming a top electrode in the opening of the insulating layer, so that the top electrode is spaced apart from the insulating layer.

In an exemplary embodiment of the present disclosure, the forming the piezoelectric ceramic layer and the bottom electrode on the substrate and transferring the bottom electrode and the piezoelectric ceramic layer to the base plate includes:
growing the piezoelectric ceramic layer on the substrate;
forming the bottom electrode on a side of the piezoelectric ceramic layer away from the substrate;
covering the base plate on the bottom electrode, and bonding the base plate to the bottom electrode through a bonding layer formed between the base plate and the bottom electrode; and
separating the substrate from the bottom electrode, the piezoelectric ceramic layer, and the base plate by cutting at a contact surface between the substrate and the piezoelectric ceramic layer using a laser cutting technology.

In an exemplary embodiment of the present disclosure, the bottom electrode and the bonding layer are both made from metal materials.

In an exemplary embodiment of the present disclosure, the bonding the base plate to the bottom electrode through the bonding layer formed between the base plate and the bottom electrode includes:
forming a first metal bonding layer on a side of the bottom electrode away from the substrate;
forming a second metal bonding layer on the base plate; and
covering the base plate on the bottom electrode, so that the first metal bonding layer and the second metal bonding layer are brought into contact, and the first metal bonding layer and the second metal bonding layer are merged as one by welding.

According to a second aspect of the present disclosure, there is provided a piezoelectric ceramic chip assembly including: a base plate, and at least one first piezoelectric ceramic chip, at least one second piezoelectric ceramic chip and an insulating layer with a second opening zone disposed on the base plate;
the first piezoelectric ceramic chip includes a first bottom electrode, a first piezoelectric ceramic layer, and a first top electrode stacked on the base plate in sequence;
the second piezoelectric ceramic chip includes a second top electrode disposed on the base plate, the second top electrode is located in the second opening zone of the insulating layer, and the second top electrode is spaced apart from the insulating layer.

In an exemplary embodiment of the present disclosure, the second piezoelectric ceramic chip further includes a second bottom electrode, the second bottom electrode is disposed around an outer periphery of the second top electrode, the insulating layer is also configured to cover the second bottom electrode, and edges of the insulating layer and the second bottom electrode close to the second top electrode are flush in a thickness direction of the base plate.

In an exemplary embodiment of the present disclosure, a projection of the first top electrode on the base plate is located within a projection of the first piezoelectric ceramic layer, and the insulating layer further has a first opening zone and the first opening zone exposes the first piezoelectric ceramic layer, the insulating layer covers edges of the first bottom electrode and the first piezoelectric ceramic layer, and the first top electrode is located within the first opening zone and spaced apart from the insulating layer.

In an exemplary embodiment of the present disclosure, the piezoelectric ceramic chip assembly further includes a bonding layer disposed between the first bottom electrode and the base plate, and also disposed between the second bottom electrode and the base plate.

In an exemplary embodiment of the present disclosure, the bottom electrode and the bonding layer are both made from metal materials.

In an exemplary embodiment of the present disclosure, the bonding layer includes a first metal bonding layer and a second metal bonding layer, and a projection of the first metal bonding layer on the base plate is completely consistent with individual projections of the first bottom electrode and the second bottom electrode, a projection of the second metal bonding layer on the base plate covers the projection of the first metal bonding layer, and edges of the first metal bonding layer and the second metal bonding layer are flush with an edge of the insulating layer in a thickness direction of the base plate.

In an exemplary embodiment of the present disclosure, a maximum outer diameter of the first piezoelectric ceramic chip and the second piezoelectric ceramic chip is greater than or equal to 5 µm.

According to a third aspect of the present disclosure, there is provided a display panel including a base substrate and the piezoelectric ceramic chip assembly described above, the base substrate being a base plate of the piezoelectric ceramic chip assembly.

According to a fourth aspect of the present disclosure, there is provided a display device including the above-mentioned display panel.

It should be noted that the above general description and the following detailed description are merely exemplary and explanatory and should not be construed as limiting of the disclosure.

BRIEF DESCRIPTION OF THE DRAWINGS

The accompanying drawings, which are incorporated in the specification and constitute a part of the specification, show exemplary embodiments of the present disclosure. The drawings along with the specification explain the principles of the present disclosure. It is apparent that the drawings in the following description show only some of the embodiments of the present disclosure, and other drawings may be obtained by those skilled in the art without departing from the drawings described herein.

DETAILED DESCRIPTION

Example embodiments will now be described more fully with reference to the accompanying drawings. However, the embodiments can be implemented in a variety of forms and should not be construed as being limited to the examples set forth herein; rather, these embodiments are disposed so that The present disclosure will be more complete so as to convey the idea of the exemplary embodiments to those skilled in this art. The same reference numerals in the drawings denote the same or similar parts, and the repeated description thereof will be omitted.

Figure 1:
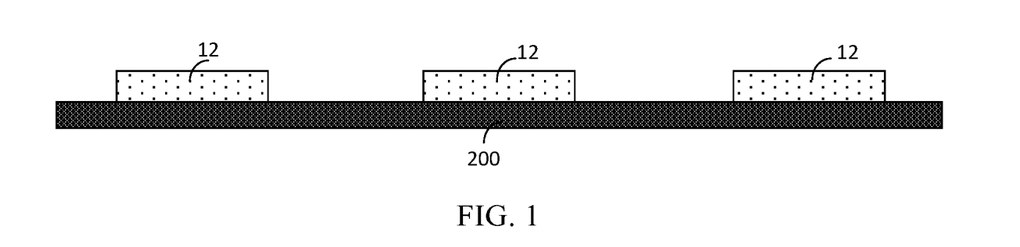
FIG. 1 is a schematic structural diagram of growing a piezoelectric ceramic layer on a substrate.
Figure 2:
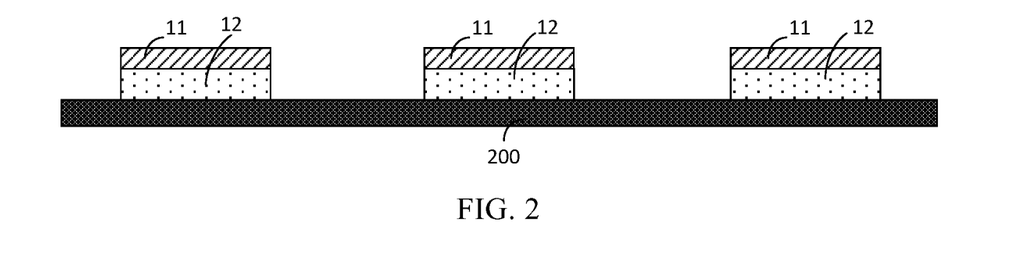
FIG. 2 is a schematic structural diagram of forming a bottom electrode on a piezoelectric ceramic layer.
Figure 3:
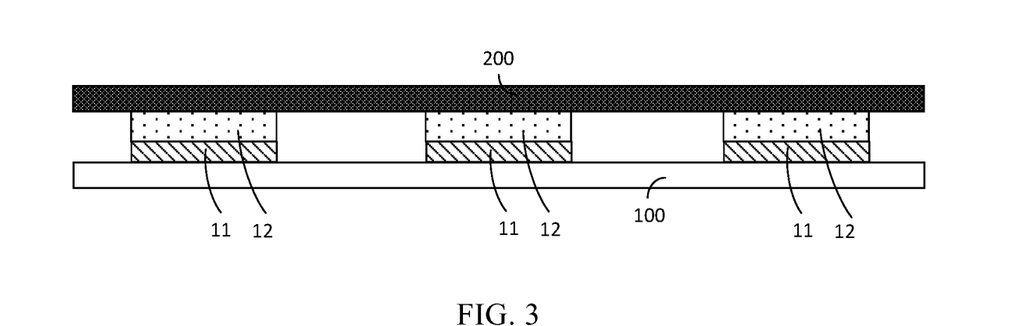
FIG. 3 is a schematic structural diagram of aligning and bonding a substrate and a base plate.
Figure 4:
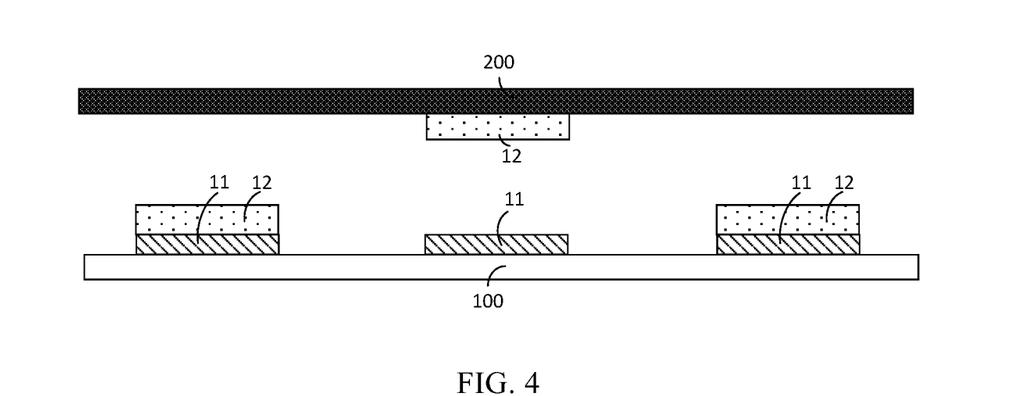
FIG. 4 is a schematic structural diagram of stripping a substrate and a base plate.
Figure 5:
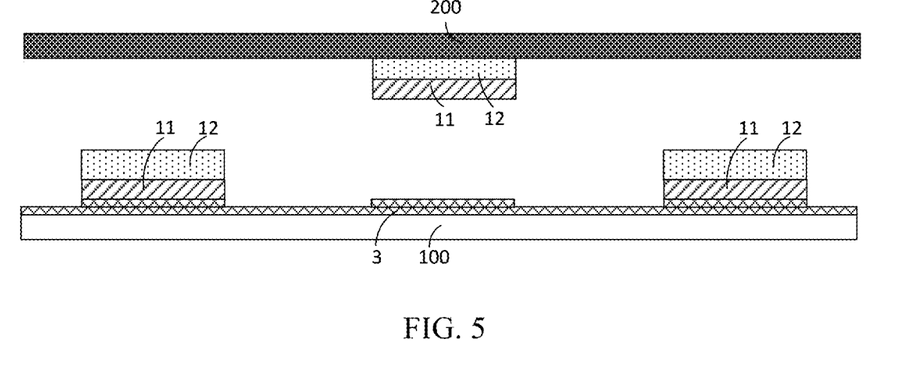
FIG. 5 is another schematic structural diagram of stripping a substrate and a base plate.

In the related art, a piezoelectric ceramic chip generally includes a piezoelectric ceramic layer 12, and a top electrode 13 and a bottom electrode 11 disposed on two sides of the piezoelectric ceramic layer 12, respectively. Upon manufacturing the piezoelectric ceramic chip, the piezoelectric ceramic layer 12 is first grown on a gem substrate 200, referring to FIG. 1. And then the bottom electrode 11 is formed on the piezoelectric ceramic layer 12, referring to FIG. 2. In order to bond the piezoelectric ceramic chip and a display panel together, there is a need to strip the piezoelectric ceramic layer 12 and the bottom electrode 11 from the substrate 200, transfer them to a base plate 100 of the display panel, and bond the bottom electrode 11 to the base plate 100 through a metal bonding layer (the metal bonding layer is coupled to the bottom electrode, so it can also be regarded as a part of the bottom electrode), referring to FIG. 3. Then, a top electrode 13 is formed on the piezoelectric ceramic layer 12. However, the inventor has found that the piezoelectric ceramic layer 12 may fail to leave the substrate 200 completely during the transfer process, resulting in that the piezoelectric ceramic chip finally bonded to the display panel merely has the bottom electrode 11 and does not have the piezoelectric ceramic layer 12. Referring to FIG. 4, the top electrode 13 manufactured later will directly contact the bottom electrode 11, causing a short circuit problem. Or, during the transfer process, the bottom electrode 11 and the piezoelectric ceramic layer 12 both fall off, that is, neither the bottom electrode 11 nor the piezoelectric ceramic layer 12 is transferred. Referring to FIG. 5, the top electrode 13 manufactured later will directly contact the metal bonding layer, which also causes a short circuit problem and chip damages and even display panel damages.

Figure 6:
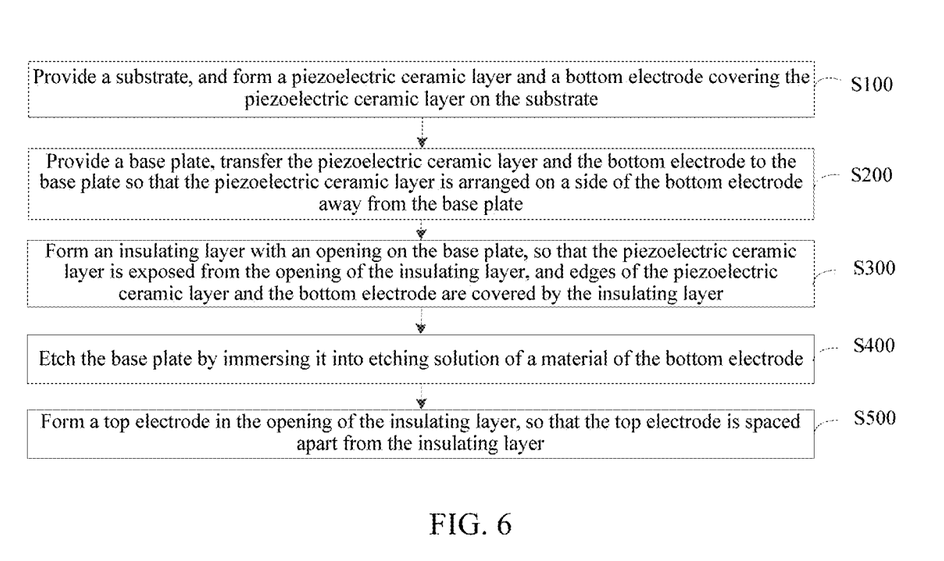
FIG. 6 is a flowchart of a manufacturing method for a piezoelectric ceramic chip of an embodiment of the present disclosure.

In view of the above problems, embodiments of the present disclosure provide a manufacturing method for a piezoelectric ceramic chip to solve the short circuit problem caused by a lack of a piezoelectric ceramics. As shown in FIG. 6, the manufacturing method for the piezoelectric ceramic chip according to the embodiments of the present disclosure includes:

In step S100, a substrate 200 is provided, and a piezoelectric ceramic layer 12 and a bottom electrode 11 covering the piezoelectric ceramic layer 12 are formed on the substrate 200.

In step S200, a base plate 100 is provided, the piezoelectric ceramic layer 12 and the bottom electrode 11 are transferred to the base plate 100 so that the piezoelectric ceramic layer 12 is located on a side of the bottom electrode 11 away from the base plate 100.

In step S300, an insulating layer 2 with an opening is formed on the base plate 100, so that the piezoelectric ceramic layer 12 is exposed from the opening of the insulating layer 2, and edges of the piezoelectric ceramic layer 12 and the bottom electrode 11 are covered by the insulating layer 2.

In step S400, the base plate 100 is immersed in an etching solution for etching a material of the bottom electrode to be etched.

In step S500, a top electrode 13 is formed in the opening of the insulating layer 2, so that the top electrode 13 is spaced apart from the insulating layer 2.

In the method of the present disclosure, after the piezoelectric ceramic layer 12 and the bottom electrode 11 are bonded to the base plate 100 of the display panel, the insulating layer 2 is manufactured to protect the edges of the piezoelectric ceramic layer 12 and the bottom electrode 11, and the piezoelectric ceramic layer 12 is exposed from the opening. When the base plate is immersed in the etching solution for etching the material of the bottom electrode 11, the successfully bonded piezoelectric ceramic layer 12 is insensitive to the etching solution and can be used as a mask to protect the bottom electrode 11 below the piezoelectric ceramic layer 12. On the contrary, in the case that the piezoelectric ceramic layer 12 is lost, since the bottom electrode 11 below is exposed to the etching solution, a portion of the bottom electrode 11 located in the opening zone will be etched away, and only a portion of the bottom electrode 11 covered by the insulating layer 2 is remained. Finally, the top electrode 13 with a size smaller than the opening zone is formed in the opening zone, so that the top electrode 13 is spaced from the edge of the insulating layer 2, which is equivalent to having a space with the top electrode 13, thereby avoiding a short circuit caused by the contact between the two. It can be seen, through the method of the present disclosure, a complete chip structure may be formed when the bonding is successful, and the chip or the display panel will not be damaged even when the bonding fails.

The manufacturing method for the piezoelectric ceramic chip according to the embodiments of the present disclosure will be described in detail below. In order to facilitate the description of the method and effect of the present disclosure, a plurality of piezoelectric ceramic chips are formed at the same time in this embodiment, among these chips, some are successfully bonded, and others are not successfully bonded. Chips that are not successfully bonded are described through an example where the piezoelectric ceramic layer 12 is not successfully bonded and the bottom electrode 11 is successfully bonded.

In step S100, the substrate 200 is provided, and a plurality of piezoelectric ceramic layers 12 and a plurality of bottom electrodes 11 covering the piezoelectric ceramic layers 12 in one-to-one correspondence are formed on the substrate 200.

Figure 7:
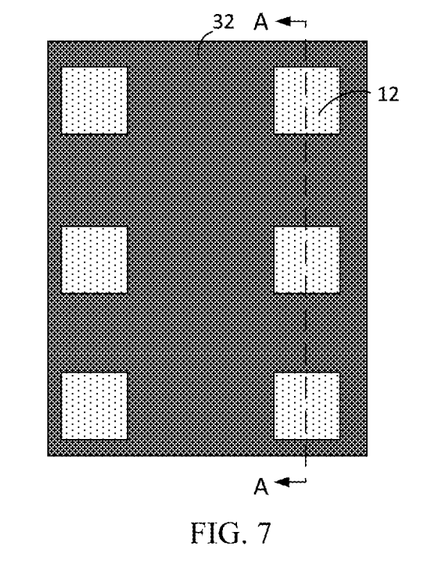
FIG. 7 is a top view during forming piezoelectric ceramic layers on a substrate.
Figure 8:
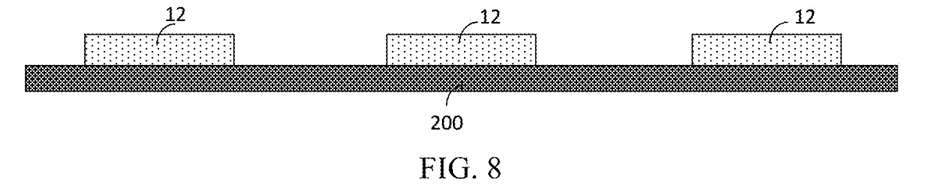
FIG. 8 is a schematic cross-sectional view along A-A in FIG. 7.

This step can be implemented according to the following steps:

In step S110, a plurality of piezoelectric ceramic layers 12 are grown on the substrate 200. Specifically, the piezoelectric ceramic layer 12 may be of various structures such as a perovskite structure, a tungsten bronze structure, and a bismuth-containing layer structure. In this step, the substrate 200 may be a sapphire substrate, which is manufactured by an epitaxial growth method. When the piezoelectric ceramic layers 12 are formed, multiple piezoelectric ceramic layers 12 can be formed at a time through a patterning process. Referring to FIGS. 7 and 8, FIG. 7 is a top view of a substrate 200 formed with six piezoelectric ceramic layers 12, and FIG. 8 is a schematic cross-section view along A-A in FIG. 7.

Figure 9:
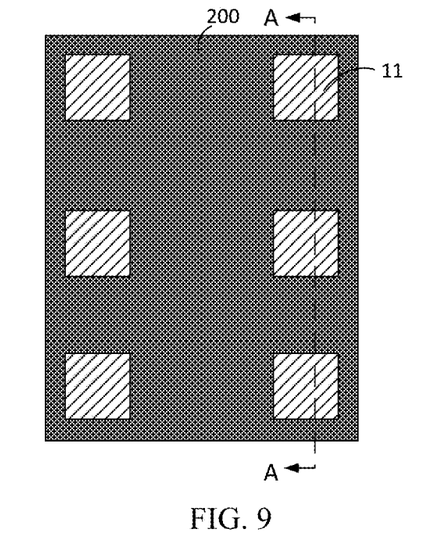
FIG. 9 is a top view during forming bottom electrodes.
Figure 10:
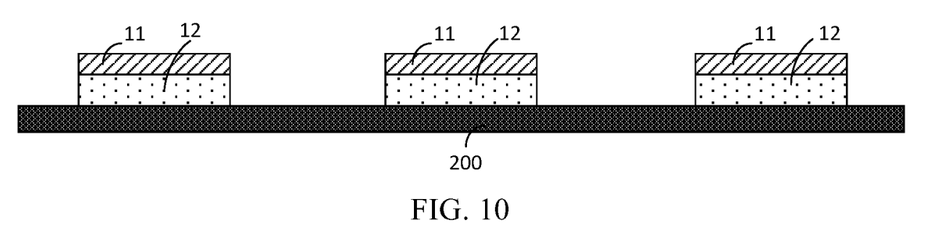
FIG. 10 is a schematic cross-sectional view along A-A in FIG. 9.

In step S120, the bottom electrode 11 is formed on a side of each piezoelectric ceramic layer 12 away from the substrate 200. Referring to FIGS. 9 and 10, FIG. 9 is a top view of the substrate formed with the bottom electrodes 11, and FIG. 10 is a schematic cross-sectional view at AA in FIG. 9. The bottom electrode 11 may be a metal electrode, such as a gold electrode, silver electrode, copper electrode, etc. The bottom electrode 11 can be formed by magnetron sputtering or vacuum evaporation.

In step S200, the base plate 100 is provided, the piezoelectric ceramic layers 12 and the bottom electrodes 11 are transferred to the base plate 100 so that the piezoelectric ceramic layers 12 are located on a side of the bottom electrodes 11 away from the base plate 100.

Since this embodiment aims to integrate the piezoelectric ceramic chip on a display panel, the base plate 100 in this step is the base plate 100 of the display panel. The base plate 100 may refer to a base substrate of a display panel, and other functional devices such as light-emitting devices, driving circuits, and touch film layers may also be formed on the base substrate. In general, the piezoelectric ceramic chip is bonded to a peripheral zone of the base substrate. The base substrate of the display panel may be a glass substrate, a quartz substrate, a plastic substrate or other transparent hard or flexible substrates. In other embodiments, when the piezoelectric ceramic chip needs to be integrated with other devices, the base plate in this step represents a base plate of other devices.

In order to transfer the piezoelectric ceramic layer 12 and the bottom electrode 11 to the base plate 100, this step can be specifically implemented as follows: in step S210, the base plate 100 is covered on the bottom electrodes 11, and the base plate 100 is bonded to the bottom electrodes 11 through a bonding layer formed between the base plate 100 and the bottom electrodes 11.

In an embodiment, to bond the base plate 100 to the bottom electrodes 11, a bonding layer is formed between the bottom electrodes 11 and the base plate 100, and the base plate 100 is bonded to the bottom electrodes 11 by the bonding layer. In a specific example, the bonding layer may be made from a metal material. The metal bonding layer can not only bond the bottom electrode 11 and the base plate 100 together, but also has conductivity and can be used as a lead to couple to an electrode (such as the cathode) of a power supply. The material of the metal bonding layer includes but is not limited to gold (Au), indium (In), tin (Sn), etc., which may be the same as or different from the material of the bottom electrode.

Figure 11:
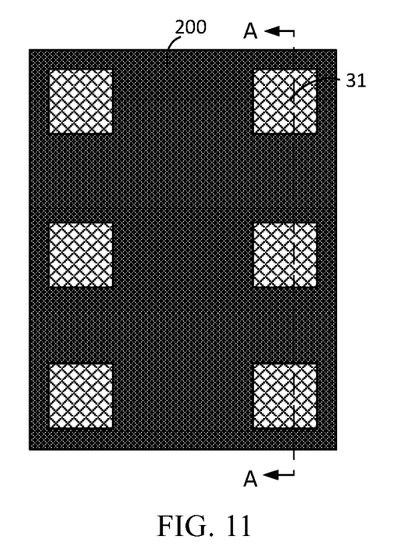
FIG. 11 is a top view during forming a first metal bonding layer.
Figure 12:
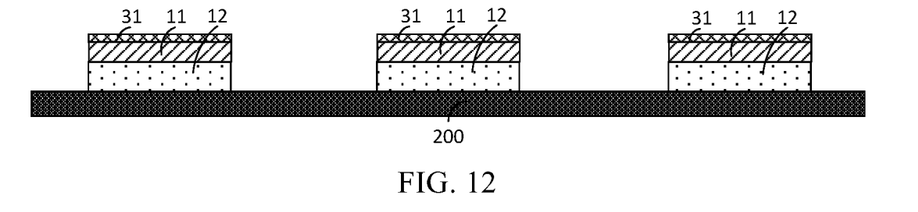
FIG. 12 is a schematic cross-sectional view along A-A in FIG. 11.
Figure 13:
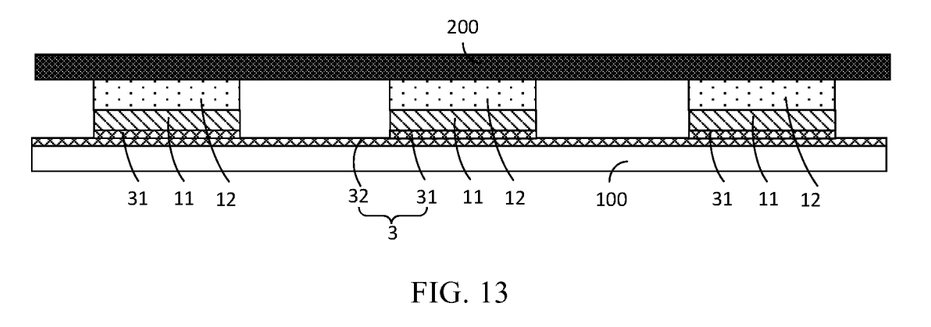
FIG. 13 is a cross-sectional view after a substrate and a base plate being aligned and bonded.

Specifically, the metal bonding layer 3 may include a first metal bonding layer 31 and a second metal bonding layer 32. The first metal bonding layer 31 is formed on a surface of each bottom electrode 11 through a patterning process, and the second metal bonding layer 32 is deposited on the whole base plate 100. When the base plate 100 and the substrate 200 are aligned and bonded, the first metal bonding layer 31 and the second metal bonding layer 32 are brought into contact, and the first metal bonding layer 31 and the second metal bonding layer 32 are welded. These two metal materials are merged in a molten state, so that the base plate 100 and the bottom electrodes are bonded together. With reference to FIGS. 11-13, FIG. 11 is a top view during forming first metal bonding layers 31, FIG. 12 is a schematic cross-sectional view along A-A in FIG. 11, and FIG. 13 is a cross-sectional view after the base plate 100 and the substrate 200 being aligned and bonded. In the figures, a size of the first metal bonding layer 31 is the same as that of the bottom electrode, but in fact it may be slightly larger than the electrode. In other embodiments, the first metal bonding layer 31 may not be patterned, that is, be a whole surface structure.

In step S220, referring to FIG. 13, the bottom electrodes 11, the piezoelectric ceramic layers 12, and the base plate 100 are from separated from the substrate 200 by cutting at a contact surface between the substrate 200 and various piezoelectric ceramic layers 12 through using a laser cutting technology.

Figure 14:
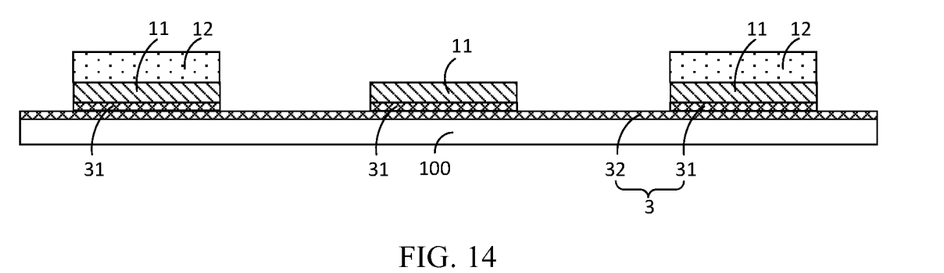
FIG. 14 is a schematic diagram of cutting a substrate and a base plate by using a laser.

The laser can instantly heat up to a boiling point of the material, and can achieve very precise material cutting, thereby smoothly separating the sapphire substrate 200 from the piezoelectric ceramic layers 12 thereon to obtain the base plate 100 formed with the bottom electrodes 11 and the piezoelectric ceramic layers 12. In this step, if the piezoelectric ceramic layer 12 is successfully separated from the substrate 200, a structure on left and right sides of the cross-sectional view will be formed. If the piezoelectric ceramic layer 12 is not cut from the substrate 200, a structure in a middle of the figure will be formed. As a result, the piezoelectric ceramic chip finally bonded to the display panel lacks the piezoelectric ceramic layer 12 and only has the bottom electrode 11, with reference to FIG. 14.

Figure 15:
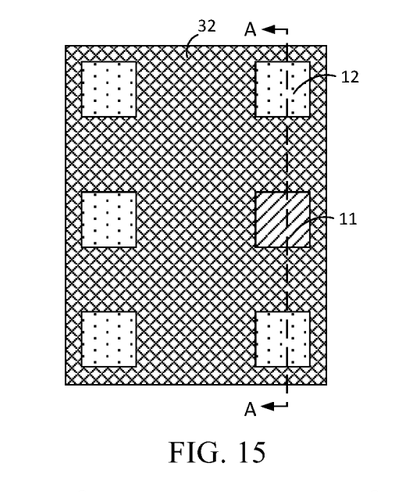
FIG. 15 is a top view during forming an insulating layer.
Figure 16:
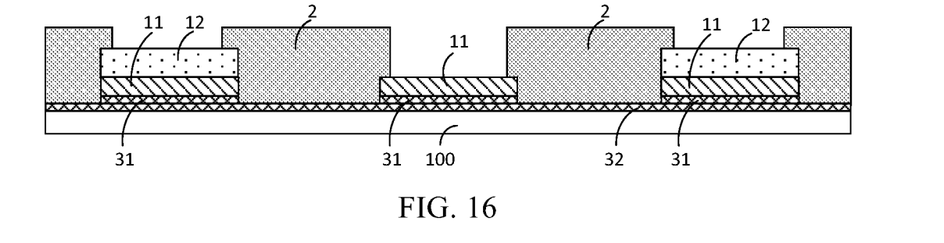
FIG. 16 is a schematic cross-sectional view along A-A in FIG. 15.

In step S300, an insulating layer 2 with multiple openings is formed on a side of individual piezoelectric ceramic layers 12 away from the bottom electrode 11, so that underlying film layers are exposed from each of the multiple openings, and edges of the individual piezoelectric ceramic layers 12 and the individual bottom electrodes 11 are covered by the insulating layer 2. With reference to FIGS. 15-16. FIG. 15 is a top view during forming an insulating layer 2, and FIG. 16 is a schematic cross-sectional view along A-A in FIG. 15.

The insulating layer 2 may adopt an inorganic insulating material, such as a metal oxide $Al_2O_3$, MgO, ZnO and the like. As shown in FIG. 16, the left and right parts of the insulating layer 2 are configured to directly cover the edges of the piezoelectric ceramic layer 12, and the piezoelectric ceramic layer 12 is exposed from the opening zone; and a middle part of the insulating layer 2 is configured to directly cover the edge of the bottom electrode 11, and the bottom electrode 11 is exposed from the opening zone.

Figure 17:
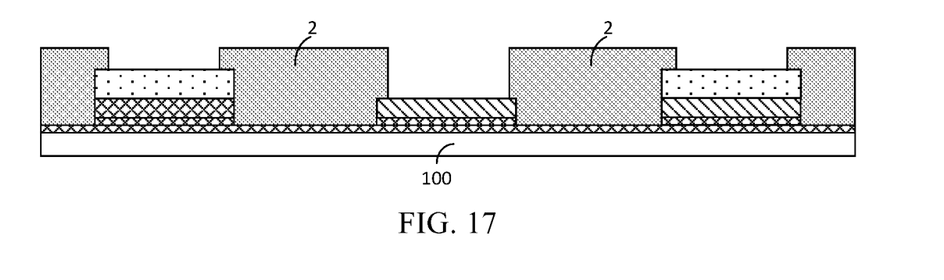
FIG. 17 is a schematic diagram of etching a base plate.
Figure 18:
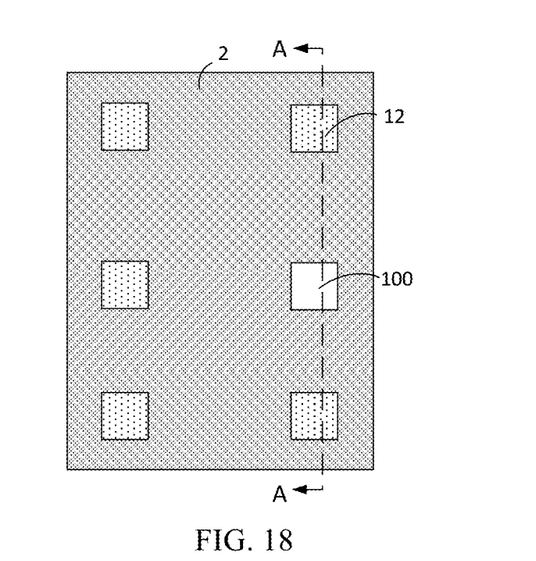
FIG. 18 is a top view after the base plate being etched.
Figure 19:
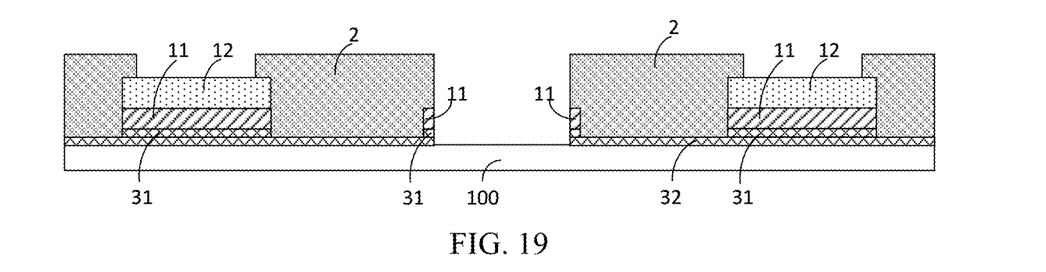
FIG. 19 is a schematic cross-sectional view along A-A in FIG. 18.

In step S400, the base plate 100 is etched by immersing it in the etching solution for etching the material of the bottom electrode 11. Referring to FIG. 17, FIG. 18 is a top view after the base plate being etched, and FIG. 19 is a schematic cross-sectional view along A-A in FIG. 18.

The etching solution for the material of the bottom electrode 11 is preferably at least one of metal etching solution, oxalic acid, nitric acid, and hydrochloric acid. The piezoelectric ceramic layer 12 and the insulating layer 2 will not react to the above etching solution, so they are used as hard masks to protect the bottom electrode 11 below, and other bottom electrodes 11 that are not covered will be etched away. Therefore, the bottom electrode 11 and piezoelectric ceramic layer 12 on the left and right sides of the cross-sectional view still maintain the original structure, and the middle bottom electrode 11 exposed from the opening zone is etched away, and only the edge parts covered by the insulating layer 2 remain. That is, the edge of the insulating layer 2 and the edge of the bottom electrode 11 are flush in a thickness direction of the base plate 100. On the other hand, since the metal bonding layer and the bottom electrode are made from similar materials, the metal bonding layer can be regarded as a part of the bottom electrode, which is sensitive to the etching solution and can also be etched by the etching solution. Therefore, edges of the first metal bonding layer 31 and the second metal bonding layer 32 will also be flush with the edges of the insulating layer 2 in the thickness direction of the substrate. It should be noted that the etching solution may be selected from other material as long as the etching solution can etch away the material of the bottom electrode 11 and cannot etch away the materials of the insulating layer 2 and the piezoelectric ceramic layer 12. Generally, the piezoelectric ceramic layer 12 is only sensitive to fluorine-based etching solutions, so it is necessary to avoid such etching solutions.

In step S500, the top electrode 13 is formed in each of the plurality of openings of the insulating layer 2, so that each top electrode 13 is spaced apart from the insulating layer 2.

Figure 20:
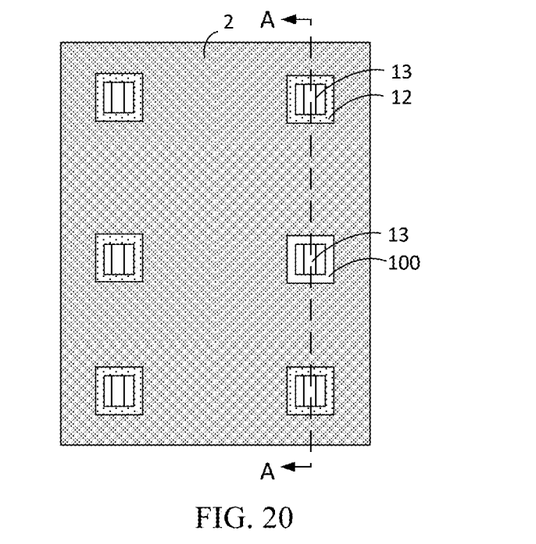
FIG. 20 is a top view during forming a top electrode.
Figure 21:
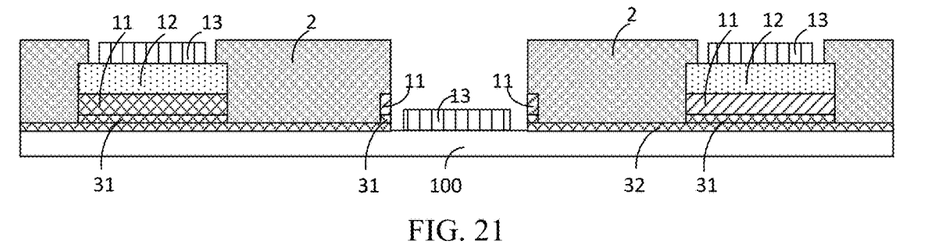
FIG. 21 is a schematic cross-sectional view along A-A in FIG. 20.

In this step, referring to FIGS. 20-21, FIG. 20 is a top view during forming a top electrode 13, and FIG. 21 is a schematic cross-sectional view along A-A in FIG. 20. In the cross-sectional view, the top electrodes 13 on the left and right sides are directly formed on the piezoelectric ceramic layer 12, and the top electrode 13 in the middle is directly formed on the base plate 100. Since the top electrode 13 is spaced apart from the insulating layer 2, the top electrode 13 in the middle will not contact the bottom electrode 11. Although the chip in the middle is not a complete chip structure, it will not cause a short circuit and will not damage the chip or the display panel. The structures in the normal bonding area on both sides are still complete chip structures, which can normally play the role of tactile representation. The materials and forming methods of the top electrode 13 and the bottom electrode 11 may be the same or different. Conventional materials and processes can be used, which will not be repeated here.

Figure 22:
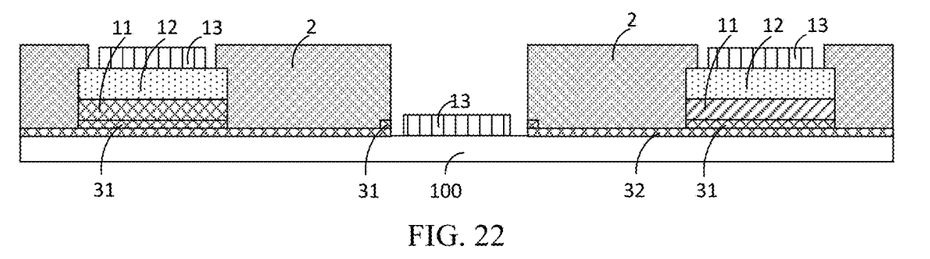
FIG. 22 is a schematic cross-sectional view of a piezoelectric ceramic chip manufactured in another embodiment.

In another embodiment, if both the piezoelectric ceramic layer 12 and the bottom electrode 11 fall off during the transfer process and the bonding is not successful, only the first metal bonding layer 31 and the second metal bonding layer 32 are arranged on the base plate 100. According to the above processes, the edges of the first metal bonding layer 31 and the second metal bonding layer 32 will be covered by the insulating layer 2, and the middle parts of the first metal bonding layer 31 and the second metal bonding layer 32 will be exposed from the opening zone of the insulating layer 2, so the middle parts of the first metal bonding layer 31 and the second metal bonding layer 32 will also be etched by the etching solution, so that the edges of the first metal bonding layer 31 and the second metal bonding layer 32 are flush with the edges of the insulating layer 2 in the thickness direction of the base plate 100. When the top electrode is subsequently formed, the top electrode 13 is also separated from the first metal bonding layer 31 and the second metal bonding layer 32, so no short circuit will occur. A structure after forming the top electrode can refer to FIG. 22.

In the above-mentioned implementations, through the manufacturing method, multiple piezoelectric ceramic chips can be manufactured as a piezoelectric ceramic chip assembly at the same time, and all of them are bonded on the display panel, which can reduce a probability of the chip damage caused by the bonding failure and the inability to achieve tactile feedback, and improve the product yield.

Figure 23:
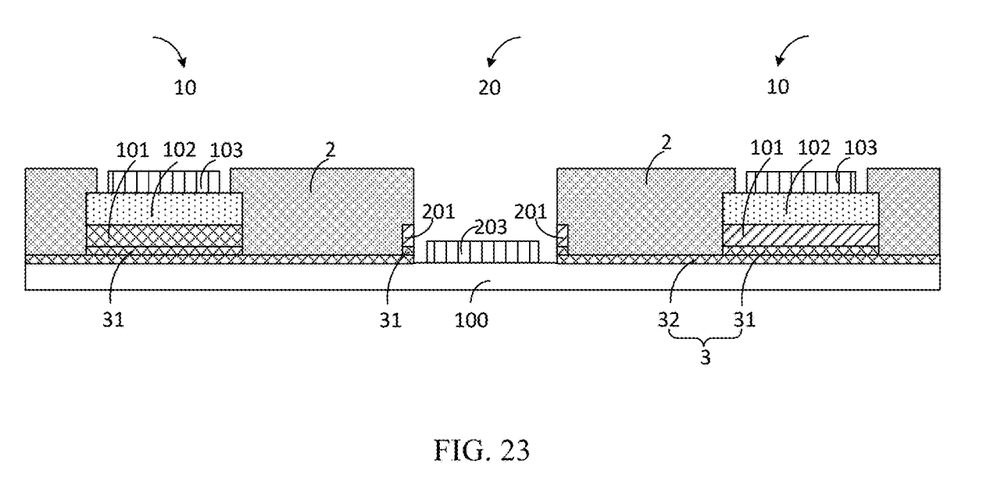
FIG. 23 is a schematic structural diagram of a piezoelectric ceramic chip assembly of an embodiment of the present disclosure.

The embodiments of the present disclosure further provide a piezoelectric ceramic chip assembly obtained by the above-mentioned manufacturing method. Referring to FIG. 23, when the piezoelectric ceramic layer 12 is not successfully bonded but the bottom electrode 11 is successfully bonded, the chip assembly manufactured by the above-mentioned method includes: the base plate 100; and at least one first piezoelectric ceramic chip 10 and at least one second piezoelectric ceramic chip 20 disposed on the base plate 100. The first piezoelectric ceramic chip 10 includes a first bottom electrode 101, a first piezoelectric ceramic layer 102, and a first top electrode 103 stacked from bottom to top on the base plate 100. The second piezoelectric ceramic chip 20 includes a second bottom electrode 201 and a second top electrode 203 formed on the base plate 100. The second bottom electrode 201 is disposed around an outer periphery of the second top electrode 203. An insulating layer 2 with a second opening is also disposed on the base plate 100, and the second bottom electrode 201 is also covered by the insulating layer 2. The second top electrode 203 is located in the second opening zone of the insulating layer 2, and the edges of the insulating layer 2 and the second bottom electrode 201 close to the second top electrode 203 are flush in the thickness direction of the base plate. The second top electrode 203 is spaced apart from the insulating layer 2. The first piezoelectric ceramic chip 10 corresponds to structures on the left and right sides in the cross-sectional view, and the second piezoelectric ceramic chip 20 corresponds to the structure in the middle of the cross-sectional view. Apparently, the first piezoelectric ceramic chip 10 is a complete chip structure, which can normally realize the tactile representation technology. The second piezoelectric ceramic chip 20 lacks the piezoelectric ceramic layer 12, which is an abnormal chip and cannot realize the tactile representation technology. However, since the bottom electrode 201 in the opening zone is etched away, the remained second bottom electrode 201 is disposed around the outer periphery of the second top electrode 203, and there is a distance between the second bottom electrode 201 and the second top electrode 203 to ensure that they do not contact. Therefore, no short circuit occurs.

Figure 24:
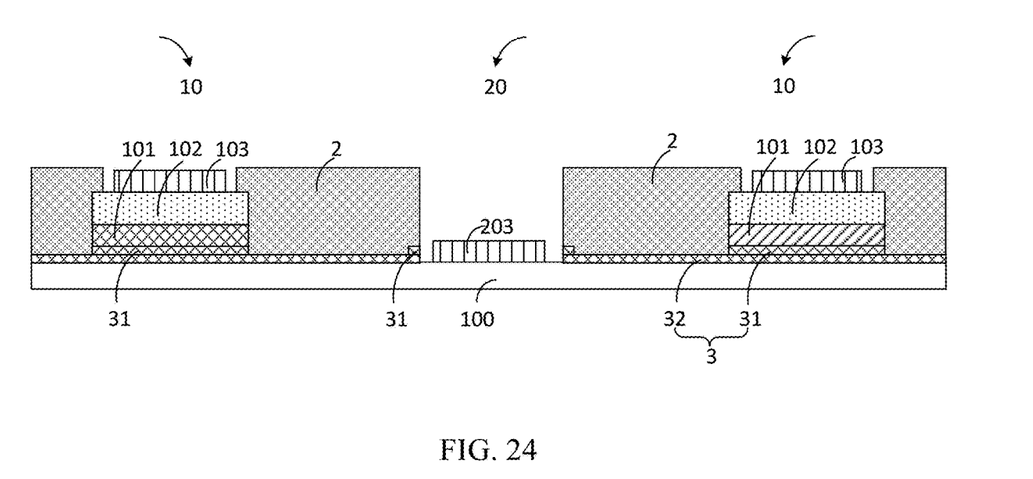
FIG. 24 is another schematic structural diagram of a piezoelectric ceramic chip assembly of an embodiment of the present disclosure.

In another embodiment, referring to FIG. 24, when the piezoelectric ceramic layer 12 and the bottom electrode 11 are both not successfully bonded, the chip assembly manufactured by the above method includes: a base plate 100; and at least one first piezoelectric ceramic chip 10 and at least one second piezoelectric ceramic chip 20 disposed on the base plate 100. The first piezoelectric ceramic chip 10 includes a first bottom electrode 101, a first piezoelectric ceramic layer 102 and a first top electrode 103 stacked from the bottom to the top on the base plate 100. The second piezoelectric ceramic chip 20 includes a second top electrode 203 formed on the base plate 100. The base plate 100 is also disposed with an insulating layer 2 having a second opening. The second top electrode 203 is located in the second opening of the insulating layer 2. The second top electrode 203 is spaced apart from the insulating layer 2. Apparently, the top electrode is also an independent structure, and there will be no short circuit.

Further, as shown in FIGS. 23 and 24, the piezoelectric ceramic chip assembly further includes a bonding layer 3, which is disposed between the first bottom electrode 101 and the base plate 100 as well as between the second bottom electrode 201 and the base plate 100, and is used for bonding the bottom electrode of each chip with the base plate 100 together. As mentioned above, the metal bonding layer 3 may include a first metal bonding layer 31 and a second metal bonding layer 32. Based on the foregoing manufacturing method, a projection of the first metal bonding layer 31 on the base plate 100 is completely consistent with individual projections of the first bottom electrode 101 and the second bottom electrode 202, a projection of the second metal bonding layer 32 on the base plate 100 covers the projection of the first metal bonding layer 31, and edges of the first metal bonding layer 31 and the second metal bonding layer 32 is flush with an edge of the insulating layer 2 in a thickness direction of the base plate. Since the first metal bonding layer 31 and the second metal bonding layer are not in contact with the second top electrode 13, no short circuit will be caused.

In this embodiment, the insulating layer 2 may also include a first opening zone to correspond to a successfully bonded chip. As shown in FIGS. 23-24, the opening zones on both sides of the insulating layer 2 are the first opening zones, and are configured to expose the first piezoelectric ceramic layer 102. The edges of the first bottom electrode 101 and the first piezoelectric ceramic layer 102 are covered by the insulating layer 2, and the first top electrode 103 is located in the first opening zone and is separated from the insulating layer 2.

In this embodiment, a size of the piezoelectric ceramic chip in the piezoelectric ceramic chip assembly can be made as small as possible, thereby increasing the number of piezoelectric ceramic chips manufactured and reducing the ratio of chip failures due to bonding failures. In the present disclosure, a maximum outer diameter of the first piezoelectric ceramic chip 10 and the second piezoelectric ceramic chip 20 may be greater than or equal to 5 µm.

The embodiments of the present disclosure further provide a display panel. The display panel includes a base substrate and the piezoelectric ceramic chip described above. The base substrate is a base plate in the piezoelectric ceramic chip assembly. In other words, each piezoelectric ceramic chip is bonded to the display panel. The display panel of this embodiment can realize the tactile feedback without being damaged due to short circuit of the chip.

The embodiments of the present disclosure further provide a display device including the above-mentioned display panel. Therefore, it also has the above-mentioned technical effects.

The present disclosure does not specifically limit the application of the display device, which may be any product or component having a display function, such as a TV, a notebook computer, a tablet computer, a wearable display device, a mobile phone, an e-book, etc.

The above embodiments are introduced by being applied to the display field. The present disclosure does not specifically limit the applicability of the piezoelectric ceramic chip assembly, which may be applied to a display device to achieve the combination of display and tactile representation, and may also be applied to other fields such as experiments equipment, testing equipment and the like.

Although the relative terms such as "above" and "below" are used in the specification to describe the relative relationship of one component to another component shown, these terms are only for convenience in this specification, for example, according to an exemplary direction shown in the drawings. It will be understood that if the device shown is flipped upside down, the component described as "above" will become a component "below" another component. When a structure is "on" another structure, it may mean that a structure is integrally formed on another structure, or that a structure is "directly" disposed on another structure, or that a structure is "indirectly" disposed on another structure through other structures.

The terms "one", "a", "the", "said", and "at least one" are used to indicate that there are one or more elements/components or the like, the terms "include" and "have" are used to indicate an open meaning of including and means that there may be additional elements/components/etc. in addition to the listed elements/components/etc.

Other embodiments of the present disclosure will be apparent to those skilled in the art after those skilled in the art consider the specification and practice the technical solutions disclosed herein. The present application is intended to cover any variations, uses, or adaptations of the present disclosure, which are in accordance with the general principles of the present disclosure and include common general knowledge or conventional technical means in the art that are not disclosed in the present disclosure. The specification and embodiments are illustrative, and the real scope and spirit of the present disclosure is defined by the appended claims.

What is claimed is:

1. A piezoelectric ceramic chip assembly, comprising: a base plate; and at least one first piezoelectric ceramic chip, at least one second piezoelectric ceramic chip and an insulating layer with a second opening zone disposed on the base plate;
   wherein, the first piezoelectric ceramic chip comprises a first bottom electrode, a first piezoelectric ceramic layer, and a first top electrode stacked on the base plate in sequence; and
   wherein, the second piezoelectric ceramic chip comprises a second top electrode disposed on the base plate, the second top electrode is located in the second opening zone of the insulating layer, and the second top electrode is spaced apart from the insulating layer.

2. The piezoelectric ceramic chip assembly according to claim 1, wherein the second piezoelectric ceramic chip further comprises a second bottom electrode, the second bottom electrode is disposed around an outer periphery of the second top electrode, the insulating layer is further configured to cover the second bottom electrode, and edges of the insulating layer and the second bottom electrode close to the second top electrode are flush in a thickness direction of the base plate.

3. The piezoelectric ceramic chip assembly according to claim 2, wherein a projection of the first top electrode on the base plate is located within a projection of the first piezoelectric ceramic layer on the base plate, and the insulating layer further comprises a first opening zone and the first piezoelectric ceramic layer is exposed from the first opening zone, edges of the first bottom electrode and the first piezoelectric ceramic layer are covered by the insulating layer, and the first top electrode is located within the first opening zone and spaced apart from the insulating layer.

4. The piezoelectric ceramic chip assembly according to claim 3, further comprising a bonding layer, wherein the bonding layer is disposed between the first bottom electrode and the base plate as well as between the second bottom electrode and the base plate.

5. The piezoelectric ceramic chip assembly according to claim 4, wherein the first bottom electrode, the second bottom electrode and the bonding layer are all made from metal materials.

6. The piezoelectric ceramic chip assembly according to claim 5, wherein the bonding layer comprises a first metal bonding layer and a second metal bonding layer, and a projection of the first metal bonding layer on the base plate is completely consistent with individual projections of the first bottom electrode and the second bottom electrode on the base plate, a projection of the second metal bonding layer on the base plate covers the projection of the first metal bonding layer, and edges of the first metal bonding layer and the second metal bonding layer are flush with an edge of the insulating layer in a thickness direction of the base plate.

7. The piezoelectric ceramic chip assembly according to claim 6, wherein a maximum outer diameter of the first piezoelectric ceramic chip and the second piezoelectric ceramic chip is greater than or equal to 5 μm.

8. A display panel comprising a base substrate and a piezoelectric ceramic chip assembly, wherein the piezoelectric ceramic chip assembly comprises: a base plate; and at least one first piezoelectric ceramic chip, at least one second piezoelectric ceramic chip and an insulating layer with a second opening zone disposed on the base plate;
   wherein, the first piezoelectric ceramic chip comprises a first bottom electrode, a first piezoelectric ceramic layer, and a first top electrode stacked on the base plate in sequence; and
   wherein, the second piezoelectric ceramic chip comprises a second top electrode disposed on the base plate, the second top electrode is located in the second opening zone of the insulating layer, and the second top electrode is spaced apart from the insulating layer,
   wherein the base substrate is served as the base plate of the piezoelectric ceramic chip assembly.

9. The display panel according to claim 8, wherein the second piezoelectric ceramic chip further comprises a second bottom electrode, the second bottom electrode is disposed around an outer periphery of the second top electrode, the insulating layer is further configured to cover the second bottom electrode, and edges of the insulating layer and the second bottom electrode close to the second top electrode are flush in a thickness direction of the base plate.

10. The display panel according to claim 9, wherein a projection of the first top electrode on the base plate is located within a projection of the first piezoelectric ceramic layer on the base plate, and the insulating layer further comprises a first opening zone and the first piezoelectric ceramic layer is exposed from the first opening zone, edges of the first bottom electrode and the first piezoelectric ceramic layer are covered by the insulating layer, and the first top electrode is located within the first opening zone and spaced apart from the insulating layer.

11. The display panel according to claim 10, further comprising a bonding layer, wherein the bonding layer is disposed between the first bottom electrode and the base plate as well as between the second bottom electrode and the base plate.

12. The display panel according to claim 11, wherein the first bottom electrode, the second bottom electrode and the bonding layer are all made from metal materials.

13. The display panel according to claim 12, wherein the bonding layer comprises a first metal bonding layer and a second metal bonding layer, and a projection of the first metal bonding layer on the base plate is completely consistent with individual projections of the first bottom electrode and the second bottom electrode on the base plate, a projection of the second metal bonding layer on the base plate covers the projection of the first metal bonding layer, and edges of the first metal bonding layer and the second metal bonding layer are flush with an edge of the insulating layer in a thickness direction of the base plate.

14. The display panel according to claim 13, wherein a maximum outer diameter of the first piezoelectric ceramic chip and the second piezoelectric ceramic chip is greater than or equal to 5 μm.

15. A display device, comprising the display panel according to claim 8.

* * * * *